United States Patent [19]

Norton

[11] Patent Number: 4,786,809

[45] Date of Patent: Nov. 22, 1988

[54] LOW NOISE PREAMPLIFICATION STAGE

[75] Inventor: Paul R. Norton, Santa Barbara, Calif.

[73] Assignee: Santa Barbara Reseach Center, Goleta, Calif.

[21] Appl. No.: 891,083

[22] Filed: Jul. 31, 1986

[51] Int. Cl.$^4$ .................................................. G01J 1/00
[52] U.S. Cl. ................................... 250/352; 307/299.1
[58] Field of Search ...................... 250/338, 342, 352; 307/399 R

[56] References Cited

U.S. PATENT DOCUMENTS

| | | | |
|---|---|---|---|
| 2,739,190 | 3/1956 | Wallace, Jr. | 307/299 R |
| 2,745,021 | 5/1956 | Kurshan | 307/299 R |
| 2,847,583 | 8/1958 | Lin | 307/299 R |
| 4,143,269 | 3/1979 | McCormack et al. | 250/352 |
| 4,421,985 | 12/1983 | Billingsley et al. | 250/352 |
| 4,682,032 | 7/1987 | Barrett | 250/352 |

OTHER PUBLICATIONS

"Low Temperature Operation of Ge Picosecond Logic Circuits," by E. S. Schlig, J. of Solid Static Circuits, Sep. 1968, pp. 271-276.
"Effects of Low Temperature on Transistor Characteristics," by A. B. Credle, IBM Journal, Jan. 1958, pp. 54-71.
"Low Level Signal Amplifiers at Cryogenic Temperatures," by Anderson et al. (1970), pp. 211-214.
"Integrated CCD-Bipolar for Focal Plane Processing of IR Signals," by Grant et al. (1975), pp. 53-58.
"A CCD Multiplexer with Forty Coupled Inputs," by Emmons et al. (1975), pp. 43-52.

Primary Examiner—Janice A. Howell
Attorney, Agent, or Firm—W. C. Schubert; V. G. Laslo; A. W. Karambelas

[57] ABSTRACT

A preamplifier circuit provides a low noise, low power buffer preamplification stage for interfacing low output impedance, low noise sensors to a readout circuit at cryogenic temperatures. The preamplifier circuit may be formed of discrete components, or it may be formed as an integrated circuit that may have a plurality of channels. Each channel includes a germanium bipolar transistor exposed to a cryogenic environment for providing voltage gain and impedance matching to interface the sensor ouptut with a multiplexer.

33 Claims, 1 Drawing Sheet

LOW NOISE PREAMPLIFICATION STAGE

BACKGROUND OF THE INVENTION

This invention relates generally to preamplification circuits for connection between a sensor and other circuitry and particularly to preamplification circuits for connection between a sensor having a low output impedance and readout circuitry having input impedance greater than the output impedance of the sensor. Still more particularly, this invention relates to preamplification circuits capable of operating at cryogenic temperatures to interface between a sensor such as a low impedance, low noise infrared sensor and a readout multiplexer circuit.

Previous techniques for interfacing sensors in a cryogenic environment have required wires between the sensors and multiplexer circuitry located outside the cryogenic environment. The packaging of such systems is costly and may permit introduction of noise since the signals output from such sensors are ordinarily at low levels. Typical sensors have output impedance in the range of 1 to 10,000 ohms, and typical readout circuitry input impedances are on the order of $10^6$ ohms so that impedance matching is essential to transfer the sensor output into the readout circuitry.

Devices such as JFETs achieve low noise operation only when operated at bias currents, and consequently, bias powers that are unsuitable for low temperature applications, especially when a large number of sensor/preamplification channels are operated together. Silicon bipolar devices have insufficient gain at the 77° K. temperature of liquid nitrogen to provide sufficient amplification of the signal output from the sensor. Gallium arsenide transistors have excessive noise at low frequencies for many sensor applications, including those that include HgCdTe detectors, which are commonly used photosensitive infrared detectors. Silicon MOS devices have noise levels that exceed the noise levels of typical sensors used in low temperature measurements.

SUMMARY OF THE INVENTION

The present invention provides a preamplifier circuit including a germanium bipolar transistor that provides a low noise, low power buffer preamplification stage for interfacing low output impedance, low noise sensors to a readout circuit at cryogenic temperatures. The preamplifier circuit according to the invention may be formed of discrete components, in the form of a hybrid circuit, or it may be formed as an integrated circuit.

The present invention comprises a circuit for interfacing the output signal of a sensor with a multiplexer or the like in a cryogenic environment having a temperature range from 10° K. to 200° K., including sensor means exposed to the cryogenic environment for producing a sensor signal indicative of a physical parameter; and means exposed to the cryogenic environment for preamplifying the sensor signal to produce an output signal having an amplitude greater than the sensor signal. The invention may further include a multiplexer in the cryogenic environment connected to the preamplifying means.

The invention may also comprise a system for interfacing signals from a sensor array with a multiplexer or the like in a cryogenic environment having a temperature range of 10° K. to 200° K., including a substrate; a plurality of sensors attached to the substrate in the cryogenic environment for providing sensor signals in response to a physical parameter; and a plurality of preamplifier means in the cryogenic environment for preamplifying the sensor signals to produce a plurality of output signals having amplitudes greater than the corresponding sensor signals.

The method of the invention may include the step of forming a plurality of germanium bipolar transistors on the substrate for amplifying the sensor signals. The invention may further include the step of forming means on the substrate for biasing the sensors and germanium bipolar transistors. The invention may include the step of connecting each of the germanium bipolar transistors to a corresponding one of the sensors in a common emitter configuration or in a common base configuration.

DESCRIPTION OF THE PREFERRED EMBODIMENT

Figure 3:
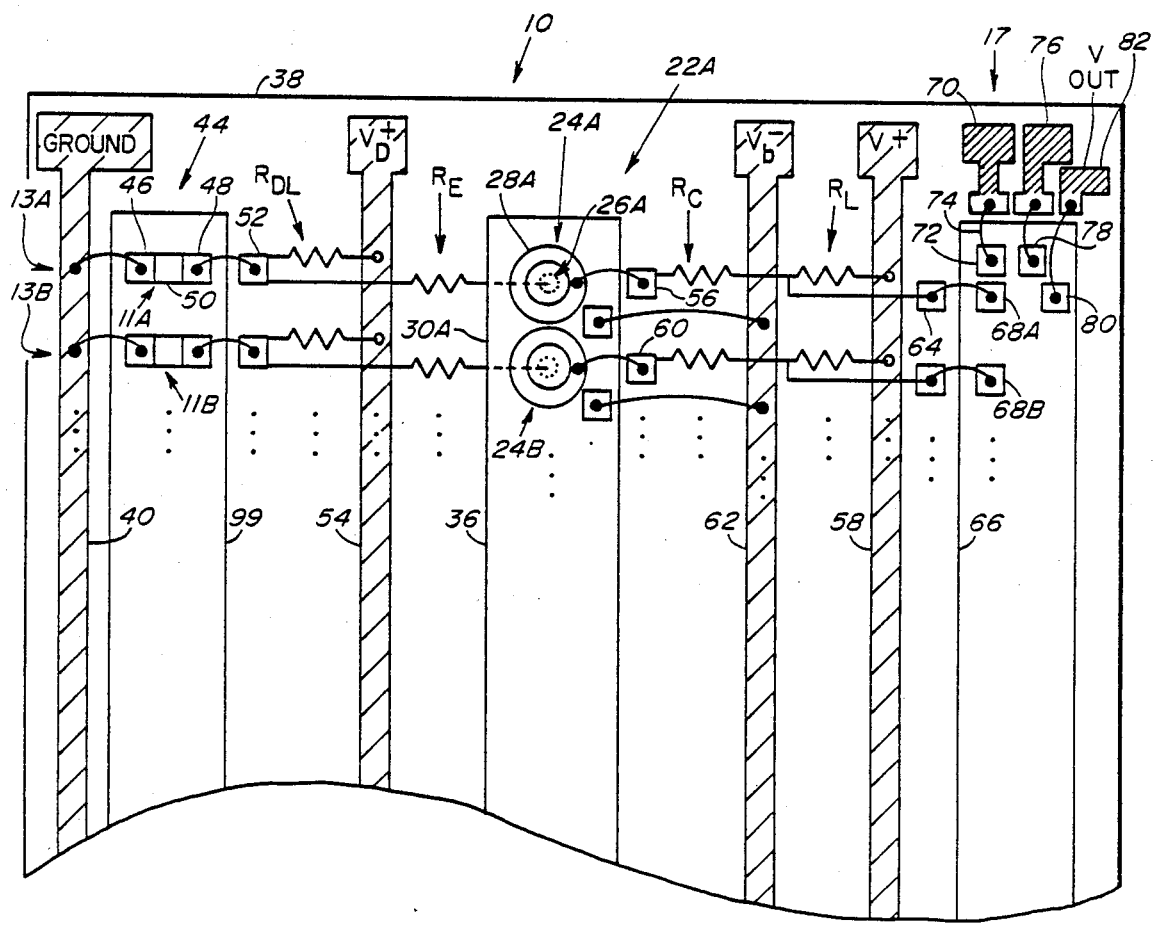
FIG. 3 is a hybrid circuit implementation of the common base circuit of FIG. 2.

Referring to FIG. 3, a sensor system 10 includes a plurality of sensors 11A, 11B, etc. Sensors 11A, 11B, etc., are connected to corresponding preamplification stages 13A, 13B, etc., respectively, which amplify the sensor outputs to voltage levels suitable for input to a multiplexer 17. Each sensor and its corresponding preamplifier comprise a channel of sensor system 10. Each of sensors 11A, 11B, etc., may be a photoconductive HgCdTe infrared sensor.

Figure 1:
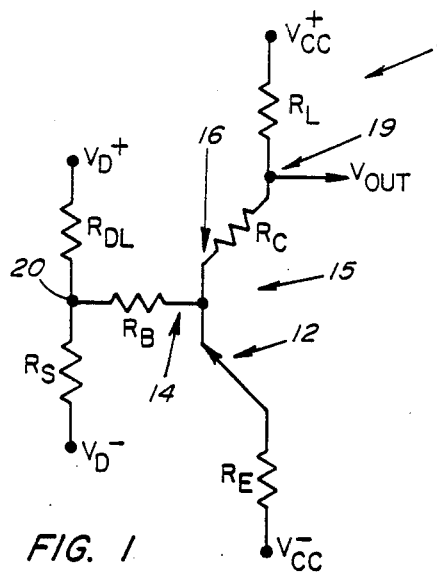
FIG. 1 is a schematic diagram of a common emitter preamplifier circuit according to the invention.

Referring to the schematic diagram of FIG. 1, a preamplification stage 22 may include a germanium bipolar transistor 15 having an emitter 12, a base 14 and a collector 16. Germanium bipolar transistor 15 is shown to be a p-n-p transistor in a common emitter configuration; however, the invention may be practiced using germanium n-p-n transistors and other circuit configurations.

Collector 16 is connected to a voltage source $+V_{cc}$ through a collector pull up resistor $R_L$ that is in series with a collector resistance $R_C$. Emitter 12 is connected to the negative terminal $-V_{cc}$ of the voltage source through a resistor $R_E$. A resistor $R_B$ is connected to base 14. Resistors $R_E$, $R_C$ and $R_B$ may be either resistances intrinsic to transistor 15, or they may be external resistances connected to the terminals of transistor 15, or both.

A detector load resistor $R_{DL}$ and a sensor resistor $R_S$ are connected to base resistor $R_B$ at a junction 20. Detector load resistor $R_{DL}$ is connected between a source of voltage $V_D$ and junction 20. The voltage $V_D$ provides bias to both the detector resistor $R_{DL}$ and to base 14 of transistor 15. Sensor resistor $R_S$ is connected to junction 20.

When the sensor is producing no output voltage, a steady state current flows between collector 16 and emitter 12. The steady state or no-signal current is determined by the biasing voltages applied to the emitter and collector junctions. When the sensor produces an output signal, the collector current flowing out of collector 16 to emitter 12 changes in proportion to the sensor output voltage. The output of preamplifier stage 22 is taken between the collector resistance Rc and ground. Preamplifier 13A provides a voltage gain of up to about 500 so that the output voltage is greater than the input voltage.

Figure 2:
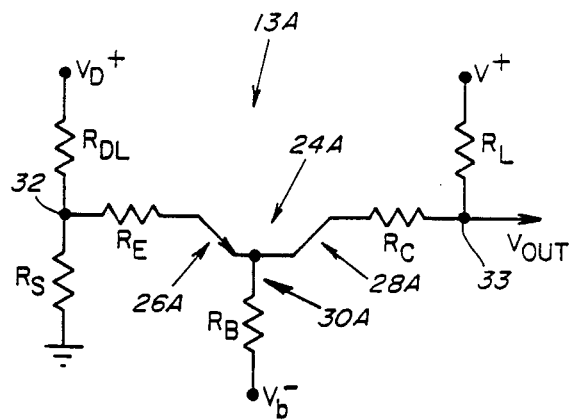
FIG. 2 is a schematic diagram of a common base preamplifier circuit according to the invention.

Referring to FIG. 2, preamplification stage 13A according to the invention includes a germanium bipolar p-n-p transistor 24A having an emitter 26A, a collector 28A and a base 30A. Transistor 24A is connected in a common base configuration with base resistance $R_B$ being connected to a voltage source $V_b^-$. Emitter resistance $R_E$ is connected to resistors $R_{DL}$ and $R_S$ at a junction 32. Collector resistance $R_C$ is connected to resistor $R_L$ at a junction 33, and the output of preamplification stage 13A is taken across collector resistance $R_C$ and ground.

Referring to FIG. 3, there is shown a hybrid circuit implementation of the invention including preamplification stage 13A and a plurality of additional common base preamplification stages 13B, etc., like preamplification stage 13A. The hybrid circuit is formed on a substrate 38 that may be a sapphire crystal, a ceramic material, oxidized silicon or other suitable electrical insulator. The hybrid circuit includes a plurality of transistors 24A, 24B, etc. Transistors 24A, 24B, etc., are essentially identical; therefore, only transistor 24A is described in detail herein.

Transistor 24A comprises a base strip 36 of n-doped germanium formed on substrate 38. The emitter 26 is a region of p+ doped germanium under base strip 36, and the collector 28 is a region of p doped germanium above base strip 36.

A ground terminal 40 is formed on substrate 38 for connection to sensors 11A, 11B, etc. Sensors 11A, 11B, etc., are formed in an array 44 on the substrate 38. The sensors are substantially identical; therefore, only sensor 11A is described in detail herein. Sensor 11A includes a pair of terminals 46 and 48 and a sensor element 50, which may be a photoconductor that is sensitive to light in the infrared region of the electromagnetic spectrum. Terminal 46 is connected to ground line 40, which is preferably formed of a metal such as aluminum that may be deposited on the substrate 38 using conventional vapor deposition techniques.

Terminal 48 is connected to a contact pad 52, which forms junction 32 of FIG. 2. Therefore, resistor $R_{DL}$ is connected between contact pad 52 and a conducting strip 54 that is at voltage $+V_D$. Contact pad 52 is also connected to resistor $R_E$, which is connected to emitter 26 of transistor 24A. Collector 28 is connected to a contact pad 56, and resistors $R_C$ and $R_L$ are connected in series between contact pad 56 and a conducting strip 58 which is at voltage $V^+$. Base 30 of transistor 24A is connected via a contact pad 60 to a conducting strip 62 that is at voltage $V_b^-$. The junction of the resistors $R_C$ and $R_L$ is connected to a contact pad 64 to connect the output of the preamplification stage 22A to multiplexer 17.

Multiplexer 17 may be formed in any convenient manner to sequentially sample the outputs of preamplification stages 22A, 22B, etc. As shown in FIG. 3, multiplexer 17 includes a substrate 66 having a plurality of electrical contacts 68A, 68B, etc., attached thereto in correspondence with the preamplification stages 22A, 22B, etc. Power is applied to multiplexer 17 via an electrical contact 70 formed on substrate 38 and an electrical contact 72 formed on substrate 66. A jumper wire 74 or other suitable conductor connects the electrical contacts 70 and 72 so that power applied to the contact 70 from an external power source (not shown) is applied to multiplexer 17. Clock signals are applied to substrate 66 through electrical contacts 76 and 78 that are connected to substrates 38 and 66 in a manner similar to contacts 70 and 72. The output of multiplexer 17 is taken from an electrical contact 80 formed on substrate 66 and connected to a contact 82 on substrate 38. As clock pulses are applied to substrate 66, multiplexer 17 sequentially connects the outputs of preamplification stages 22A, 22B, etc., to output contact 80. The multiplexer may require a plurality of clock drives, in which case there may be contacts for each clock drive.

The entire sensor system 10 and all components thereof are functional at cryogenic temperatures in a range including the 10° K. to 200° K. The sensors typically have output impedances in the range of 1-10,000 ohm, and the multiplexer 13 typically has an impedance on the order of $10^4$-$10^9$ ohm. Amplification and impedance matching are necessary to provide inputs to multiplexer 13 that may be distinguished from the background noise level thereof. The preamplification stages described herein provide amplification with an input noise level of about 1 nV/Hz$^{\frac{1}{2}}$ with power dissipation of less than 100 microwatts and voltage gain per channel of about 100.

The present invention provides an integrated hybrid assembly that combines the sensor, preamplifier, resistors and multiplexer components on the common substrate 38. The contact pads that are attached to the substrate 38 may be either bump type or wire bond pads. Resistors may be formed on the substrate by deposition of resistive materials, such as NiCr; and these resistors may be trimmable after the integrated circuit has been assembled and tested to provide uniformity of output from the channels of the sensor array, preamplifier and multiplexer combination.

In addition, the invention covers the possibility that any or all of the components, including the sensor array 44, substrate 38, transistor array 36 and multiplexer 17, may be formed together on a germanium substrate, so as to constitute several or all of these components in the manner of a germanium integrated circuit.

What is claimed is:

1. A circuit for interfacing signals from a sensor with a multiplexer or the like in an environment having a temperature range between 10° K. and 200° K., comprising:
    sensor means exposed to said environment for producing a sensor signal indicative of a physical parameter; and
    means, comprising germanium, and exposed to said environment for preamplifying the sensor signal to produce an output signal having an amplitude greater than the sensor signal.

2. The circuit of claim 1 wherein said sensor means has a predetermined output impedance, further including a multiplexer in the cryogenic environment connected to said preamplifying means, said multiplexer having a predetermined multiplexer input impedance.

3. The circuit of claim 2 wherein said multiplexer input impedance is greater than said sensor output impedance and said preamplifying means provides an impedance match between said sensor and said multiplexer.

4. The circuit of claim 2 wherein said sensor includes means sensitive to electromagnetic radiation in the infrared region of the spectrum for producing the sensor signal.

5. The circuit of claim 4 wherein said preamplifying means includes a germanium bipolar transistor.

6. The circuit of claim 1 wherein said said sensor includes means sensitive to electromagnetic radiation in the infrared region of the spectrum for producing the sensor signal.

7. The circuit of claim 1 wherein said preamplifying means includes a germanium bipolar transistor.

8. The circuit of claim 7 wherein said germanium bipolar transistor is connected to said sensor in a common base configuration.

9. The circuit of claim 7 wherein said germanium bipolar transistor is connected to said sensor in a common emitter configuration.

10. A system for interfacing signals from a sensor array with a multiplexer or the like in a cryogenic environment having a temperature range of 10° K. and above, comprising:
   a substrate;
   a plurality of sensors attached to said substrate in said environment for providing sensor signals in response to a physical parameter; and
   a plurality of preamplifier means, comprising germanium, and in said environment for preamplifying the sensor signals to produce a plurality of output signals having amplitudes greater than the corresponding sensor signals.

11. The system of claim 10 wherein said preamplifier means includes a plurality of germanium bipolar transistors formed on said substrate.

12. The system of claim 10 further including means formed on said substrate for biasing said germanium bipolar transistors.

13. The system of claim 10 wherein each of said germanium bipolar transistors is connected to a corresponding one of said sensors in a common emitter configuration.

14. The system of claim 10 wherein each of said germanum bipolar transistors is connected to a corresponding one of said sensors in a common base configuration.

15. The system of claim 10 further including a multiplexer formed on said substrate for receiving the signals output from said plurality of preamplifiers.

16. A method for interfacing the output signal of a sensor with a multiplexer or the like in an environment having a temperature range of 10° K. and above, comprising the steps of:
   producing a sensor signal indicative of a physical parameter with sensor means exposed to said environment; and
   preamplifying the sensor signal with preamplifying means, comprising germanium, and exposed to said environment to produce an output signal having an amplitude greater than the sensor signal.

17. The method of claim 16, further including the step of connecting a multiplexer in said environment to said preamplifying means.

18. The method of claim 17, further including the step of providing an impedance match between said sensor and said multiplexer.

19. The method of claim 17, further including the step of producing the sensor signal in response to electromagnetic radiation in the infrared region of the spectrum.

20. The method of claim 19 wherein said preamplifying step includes amplifying the sensor signal with a germanium bipolar transistor.

21. The method of claim 16, further including the step of producing the sensor signal in response to electromagnetic radiation in the infrared region of the spectrum.

22. The method of claim 16 wherein said preamplifying step includes amplifying the sensor signal with a germanium bipolar transistor.

23. The method of claim 22 further including the step of connecting said germanium bipolar transistor to said sensor in a common base configuration.

24. The method of claim 22 further including the step of connecting said germanium bipolar transistor to said sensor in a common emitter configuration.

25. A method for interfacing signals from a sensor array with a multiplexer or the like in an environment having a temperature range between 10° K. and 200° K., comprising the steps of:
   forming a substrate;
   attaching a plurality of sensors to said substrate in the environment for providing sensor signals in response to a physical parameter; and
   preamplifying the sensor signals with preamplifying means, comprising germanium, and in the environment to produce a plurality of output signals having amplitudes greater than the corresponding sensor signals.

26. The method of claim 25 wherein said preamplifying step includes the step of forming a plurality of germanium bipolar transistors on said substrate for amplifying the sensor signals.

27. The system of claim 25 further including the step of forming means on said substrate for biasing said germanium bipolar transistors.

28. The system of claim 25 further including the step of connecting each of said germanium bipolar transistors to a corresponding one of said sensors in a common emitter configuration.

29. The system of claim 25 further including the step of connecting each of said germanium bipolar transistors to a corresponding one of said sensors in a common base configuration.

30. The system of claim 25 further including the step of forming a multiplexer on said substrate for receiving the signals output from said preamplifying means.

31. A preamplifier circuit in an environment including temperatures between 10° K. and 200° K., comprising means for receiving an input electrical signal and means comprising germanium for providing an output electrical signal greater than the input signal.

32. The preamplifier circuit of claim 31 further comprising a germanium bipolar transistor for receiving the input electrical signal and providing the output signal.

33. The preamplifier circuit of claim 32 further comprising:
   a sensor in the environment responsive to electromagnetic waves in the infrared region of the electromagnetic spectrum for providing the input signal to the transistor; and
   a multiplexer in the environment for receiving the signal output from the transistor.

* * * * *